US011789059B2

(12) United States Patent
Naidu et al.

(10) Patent No.: US 11,789,059 B2
(45) Date of Patent: Oct. 17, 2023

(54) PARAMETER INDEPENDENT TRAVELING WAVE-BASED FAULT LOCATION USING UNSYNCHRONIZED MEASUREMENTS

(71) Applicant: Hitachi Energy Switzerland AG, Baden (CH)

(72) Inventors: Od Naidu, Karnataka (IN); Preetham Venkat Yalla, Karnataka (IN); Neethu George, Karnataka (IN)

(73) Assignee: HITACHI ENERGY SWITZERLAND AG, Baden (CH)

( * ) Notice: Subject to any disclaimer, the term of this patent is extended or adjusted under 35 U.S.C. 154(b) by 0 days.

(21) Appl. No.: 17/795,300

(22) PCT Filed: Jan. 29, 2021

(86) PCT No.: PCT/EP2021/052221
§ 371 (c)(1),
(2) Date: Jul. 26, 2022

(87) PCT Pub. No.: WO2021/152157
PCT Pub. Date: Aug. 5, 2021

(65) Prior Publication Data
US 2023/0083768 A1    Mar. 16, 2023

(30) Foreign Application Priority Data

Jan. 30, 2020 (IN) .............................. 202041004115

(51) Int. Cl.
*G01R 31/08* (2020.01)
(52) U.S. Cl.
CPC .................................. *G01R 31/085* (2013.01)
(58) Field of Classification Search
CPC ................................................... G01R 31/085
See application file for complete search history.

(56) References Cited

U.S. PATENT DOCUMENTS

| 2014/0074414 A1* | 3/2014 | Schweitzer, III | ........ H02H 7/26 |
| | | | 702/59 |
| 2017/0085481 A1 | 3/2017 | Park et al. | |

(Continued)

FOREIGN PATENT DOCUMENTS

| DE | 102017212730 A1 | 1/2019 |
| EP | 3442125 A1 | 2/2019 |

(Continued)

OTHER PUBLICATIONS

Eichinger et al., "A Time-Series Compression Technique and its Application to the Smart Grid", The VLDB Journal, http://dx.doi.org/10.1007/s00778-014-0368-8, 26 pages.

(Continued)

*Primary Examiner* — Feba Pothen
(74) *Attorney, Agent, or Firm* — PROCOPIO, CORY, HARGREAVES & SAVITCH

(57) ABSTRACT

Examples of fault location in a power transmission line connecting a first and a second terminal is described. In an example, arrival times of a first peak, a second peak, and a third peak of a travelling wave detected from measurements carried out at the first and second terminals is detected. A rise time associated with the first peak of the travelling wave is calculated. One of a first half and a second half of the power transmission line is identified, as having a fault, based on a comparison of the rise time. One of a first segment, a second segment, a third segment, and a fourth segment of the power transmission line is identified as having the fault. Length of the power transmission line is estimated. The fault location is estimated based on identification of one of the first, second, third, and fourth segments as having the fault.

22 Claims, 9 Drawing Sheets

(56) References Cited

U.S. PATENT DOCUMENTS

| | | | |
|---|---|---|---|
| 2018/0034265 A1* | 2/2018 | Naidu | H02H 7/265 |
| 2019/0121347 A1 | 4/2019 | Cella et al. | |
| 2020/0096551 A1* | 3/2020 | Emanuel | G01R 31/085 |

FOREIGN PATENT DOCUMENTS

| | | |
|---|---|---|
| IN | 201741041164 A | 5/2019 |
| WO | 2014/190190 A1 | 11/2014 |
| WO | 2017/114578 A1 | 7/2017 |
| WO | 2018/007857 A1 | 1/2018 |
| WO | 2018/122627 A1 | 7/2018 |
| WO | 2018/229090 A1 | 12/2018 |
| WO | 2019/015738 A1 | 1/2019 |
| WO | 2019/097311 A1 | 5/2019 |

OTHER PUBLICATIONS

Harvan et al., "Processing Encrypted and Compressed Time-Series Data", 2017 IEEE 37th International Conference on Distributed Computing Systems, DOI 10.1109/ICDCS.2017.114, p. 1053-1062, 2017.

Kong et al., "Embracing Big Data with Compressive Sensing; A Green Approach in Industrial Wireless Networks", IEEE Communications Magazine, Oct. 2016, 0163-6804/16$25.00, p. 53-59.

Park et al., "Data Compression and Prediction Using Machine Learning for Industrial IoT", XP-002796514, 978-1-5386-2290-2/18$31.00, ICOIN 2018, p. 818-820.

Miarcelloni et al., "A Simple Algorithm for Data Compression in Wireless Sensor Networks", IEEE Communications Letters, vol. 12 No.6, Jun. 2008, p. 411-413, XP-002796515.

Wikipedia, "Autoencoder", https://en.wikipedia.org/w/index.php?title=Autoencoder&oldid=897670835, May 2019, 8 pages.

Wikipedia, "Data compression", https://en.wikipedia.org/w/index.php?title=Data_compression&oldid=971922197, Aug. 9, 2020, 18 pages.

Wikipedia, "Push technology", https://en.wikipedia.org/w/index.php?title=Push_technology&oldid=897487695, Aug. 16, 2020, 8 pages.

International Search Report and Written Opinion of the International Searching Authority for the corresponding PCT Application No. PCT/EP2021/052221 dated May 3, 2021, 11 pages.

* cited by examiner

TABLE I

| Test Case | Conventional methods | | | | Method of the present invention | | |
|---|---|---|---|---|---|---|---|
| | Synch. Error (µs) | Calculated Fault Location (Km) | Error (metre) | Error (%) | Calculated Fault Location (Km) | Error (m) | Error (%) |
| A-g fault, fault resistance 50Ω, fault inception angle 600 and fault location of 50km from first terminal (Bus A side) | 0.0 | 49.948 | 51 | 0.02 | 49.926 | 74 | 0.03 |
| | 1.0 | 49.803 | 196 | 0.09 | 49.926 | 74 | 0.03 |
| | 5.0 | 49.222 | 778 | 0.38 | 49.926 | 74 | 0.03 |
| | 10.0 | 48.496 | 1503 | 0.75 | 49.926 | 74 | 0.03 |
| | 50.0 | 42.688 | 7311 | 3.65 | 49.926 | 74 | 0.03 |
| | 100.0 | 35.428 | 1457 | 7.28 | 49.926 | 74 | 0.03 |
| A-g fault, fault resistance 50Ω, fault inception angle 600 and fault location of 90km from first terminal | 0.0 | 89.981 | 18.749 | 0.01 | 89.854 | 146 | 0.07 |
| | 1.0 | 89.836 | 163 | 0.08 | 89.854 | 146 | 0.07 |
| | 5.0 | 90.562 | 562 | 0.28 | 89.854 | 146 | 0.07 |
| | 10.0 | 91.288 | 1288 | 0.64 | 89.854 | 146 | 0.07 |
| | 50.0 | 97.096 | 7096 | 3.54 | 89.854 | 146 | 0.07 |
| | 100.0 | 104.355 | 14355 | 7.17 | 89.854 | 146 | 0.07 |

Fig. 4a

TABLE I

| | | | | | | | |
|---|---|---|---|---|---|---|---|
| A-g fault, fault resistance 50Ω, fault inception angle 600 and fault location of 110km from first terminal (Bus A side) | 0.0 | 110.163 | 163 | 0.08 | 110.014 | 14 | 0.01 |
| | 1.0 | 110.309 | 309 | 0.15 | 110.014 | 14 | 0.01 |
| | 5.0 | 110.889 | 889 | 0.44 | 110.014 | 14 | 0.01 |
| | 10.0 | 111.615 | 1615 | 0.80 | 110.014 | 14 | 0.01 |
| | 50.0 | 117.423 | 7423 | 3.71 | 110.014 | 14 | 0.01 |
| | 100.0 | 124.683 | 1468 | 7.34 | 110.014 | 14 | 0.01 |
| A-g fault, fault resistance 50Ω, fault inception angle 600 and fault location of 150km from first terminal (Bus A side | 0.0 | 149.948 | 51 | 0.02 | 150.144 | 144 | 0.07 |
| | 1.0 | 150.093 | 93 | 0.04 | 150.144 | 144 | 0.07 |
| | 5.0 | 150.674 | 674 | 0.33 | 150.144 | 144 | 0.07 |
| | 10.0 | 151.400 | 1400 | 0.70 | 150.144 | 144 | 0.07 |
| | 50.0 | 157.208 | 7208 | 3.60 | 150.144 | 144 | 0.07 |
| | 100.0 | 164.684 | 14468 | 7.23 | 150.144 | 144 | 0.07 |

Fig. 4b

TABLE II

| Test Case | Conventional methods | | | | Method of the present invention | | |
|---|---|---|---|---|---|---|---|
| | Wave speed error (%) | Calculated Fault Location (Km) | Error (m) | Error (%) | Calculated Fault Location (km) | Error (m) | Error (%) |
| A-g fault, fault resistance 50Ω, fault inception angle 600 and fault location of 50km from first terminal (Bus A side) | 0.0 | 49.948 | 51 | 0.02 | 49.926 | 74 | 0.03 |
| | 0.5 | 49.801 | 198 | 0.09 | 49.926 | 74 | 0.03 |
| | 1.0 | 49.551 | 449 | 0.22 | 49.926 | 74 | 0.03 |
| | 2.0 | 49.052 | 947 | 0.47 | 49.926 | 74 | 0.03 |
| | 5.0 | 47.554 | 2445 | 1.22 | 49.926 | 74 | 0.03 |
| | 10.0 | 45.056 | 4943 | 2.47 | 49.926 | 74 | 0.03 |
| A-g fault, fault resistance 50Ω, fault inception angle 600 and fault location of 90km from first terminal ( | 0.0 | 89.981 | 18.749 | 0.01 | 89.854 | 146 | 0.07 |
| | 0.5 | 89.785 | 214 | 0.11 | 89.854 | 146 | 0.07 |
| | 1.0 | 89.734 | 265 | 0.13 | 89.854 | 146 | 0.07 |
| | 2.0 | 89.632 | 367 | 0.18 | 89.854 | 146 | 0.07 |
| | 5.0 | 89.327 | 672 | 0.33 | 89.854 | 146 | 0.07 |
| | 10.0 | 88.819 | 1180 | 0.59 | 89.854 | 146 | 0.07 |

Fig. 5a

TABLE II

| | 0.0 | 110.163 | 163 | 0.08 | 110.014 | 14 | 0.01 |
|---|---|---|---|---|---|---|---|
| A-g fault, fault resistance 50Ω, fault inception angle 600 and fault location of 110km from first terminal (Bus A side) | 0.5 | 110.214 | 214 | 0.11 | 110.014 | 14 | 0.01 |
| | 1.0 | 110.265 | 265 | 0.13 | 110.014 | 14 | 0.01 |
| | 2.0 | 110.367 | 367 | 0.18 | 110.014 | 14 | 0.01 |
| | 5.0 | 110.672 | 672 | 0.33 | 110.014 | 14 | 0.01 |
| | 10.0 | 111.180 | 1180 | 0.59 | 110.014 | 14 | 0.01 |
| A-g fault, fault resistance 50Ω, fault inception angle 600 and fault location of 150km from first terminal (Bus A side) | 0.0 | 149.948 | 51 | 0.02 | 150.144 | 144 | 0.07 |
| | 0.5 | 150.198 | 198 | 0.09 | 150.144 | 144 | 0.07 |
| | 1.0 | 150.448 | 448 | 0.22 | 150.144 | 144 | 0.07 |
| | 2.0 | 150.947 | 947 | 0.47 | 150.144 | 144 | 0.07 |
| | 5.0 | 152.445 | 2445 | 1.22 | 150.144 | 144 | 0.07 |
| | 10.0 | 154.943 | 4943 | 2.47 | 150.144 | 144 | 0.07 |

Fig. 5b

PARAMETER INDEPENDENT TRAVELING WAVE-BASED FAULT LOCATION USING UNSYNCHRONIZED MEASUREMENTS

CROSS-REFERENCE TO RELATED APPLICATIONS

The present application is a national stage entry of International Application No. PCT/EP2021/052221, filed on Jan. 29, 2021, which claims priority to Indian Application No. 202041004115, filed on Jan. 30, 2020, which are both hereby incorporated herein by reference as if set forth in full.

TECHNICAL FIELD

The present disclosure relates, in general, to fault location in power transmission lines. In particular, the present disclosure relates to traveling wave-based fault location independent of line parameters and using unsynchronized measurements.

BACKGROUND

An electric power transmission system is a large and complex network that consists of transmission and distribution lines and numerous electrical components such as generators, transformers, relays, Intelligent electronic devices (IEDs), etc. Transmission lines are often subjected to faults due to storms, lightning, snow, freezing rain, insulation breakdown, and short circuit faults caused by birds, tree branches, and other external objects. Generally, fault is defined as an abnormal condition of the electrical system causing disruption in the normal flow of electric current. This deviated flow of electric current causes change in voltage and/or current flow, which interrupts power transmission.

Restoration of power supply after faults can be done only after the maintenance team finishes the repair of the damage caused by the fault. Thus, accurate fault location in transmission lines is important, so that the maintenance crew can reach the fault location and undertake repair to restore the power transmission. Quick identification of fault location improves the reliability, restoration of power supply and reduce the revenue loss for the utilities.

SUMMARY

The present disclosure relates to a method for fault location in a power transmission line connecting a first terminal with a second terminal, the method comprising obtaining arrival times of a first peak, a second peak, and a third peak of a travelling wave detected from measurements carried out at each of the first and second terminals; calculating a rise time associated with the first peak of the travelling wave detected from the measurements carried out at the first and second terminals; identifying one of a first half and a second half of the power transmission line, as having a fault, based on a comparison of the rise time estimated for the first peak of the travelling wave at the first and second terminals; identifying one of a first segment, a second segment, a third segment, and a fourth segment of the power transmission line as having the fault, based on the identification of one of the first and the second half as having the fault, and a comparison of the arrival times of the first, second, and third peaks of the travelling wave at the first and second terminals; estimating lengths of the power transmission line based on identification of one of the first, second, third, and fourth segments as having the fault, a comparison of the arrival times of the first, second, and third peaks of the travelling wave, arrival time of a first peak of a travelling wave reflected from the second terminal detected from the measurements carried out at the first terminal, and arrival time of a first peak of a travelling wave reflected from the first terminal detected from the measurements carried out at the second terminal; and estimating the fault location based on the identification of one of the first, second, third, and fourth segments as having the fault, the arrival times of the first, second, and third peaks of the travelling wave detected from measurements carried out at the first and second terminals, and estimated lengths of the power transmission line.

The present disclosure also relates to a device for fault location in a power transmission line connecting a first terminal with a second terminal, the device comprising: a travelling wave detector to detect a first peak, a second peak, and a third peak of a travelling wave detected from measurements carried out at the first and second terminals; obtain arrival times of the first peak, the second peak, and the third peak of the travelling wave detected from measurements carried out at the first and second terminals; and calculate a rise time associated with the first peak of the travelling wave detected from the measurements carried out at the first and second terminals; a fault localization module configured to: identify one of a first half and a second half of the power transmission line, as having a fault, based on a comparison of the calculated rise time associated with the first peak of the travelling wave; identify one of a first segment, a second segment, a third segment, and a fourth segment of the power transmission line as having the fault, based on the identification of one of the first and the second half as having the fault, and a comparison of the arrival times of the first, second, and third peaks of the travelling wave; a fault location module coupled to the processor to: estimate lengths of the power transmission line based on identification of one of the first, second, third, and fourth segments as having the fault, a comparison of the arrival times of the first, second, and third peaks of the travelling wave, arrival time of a first peak of a travelling wave reflected from the second terminal detected from the measurements carried out at the first terminal, and arrival time of a first peak of a travelling wave reflected from the first terminal detected from the measurements carried out at the second terminal; and estimate the fault location based on the identification of one of the first, second, third, and fourth segments as having the fault, the arrival times of the first, second, and third peaks of the travelling wave detected from measurements carried out at the first and second terminals, and estimated lengths of the power transmission line.

BRIEF DESCRIPTION OF DRAWINGS

The following detailed description references the drawings, wherein:

FIGS. 4a and 4b illustrate a tabular comparison of conventional two terminal method for fault location and the present embodiments for various synchronization errors, according to an example; and FIGS. 5a and 5b illustrate a tabular comparison of conventional two terminal method for fault location and the method of the present disclosure for various wave speed (parameter) errors, according to an example.

DETAILED DESCRIPTION

Figure 1:
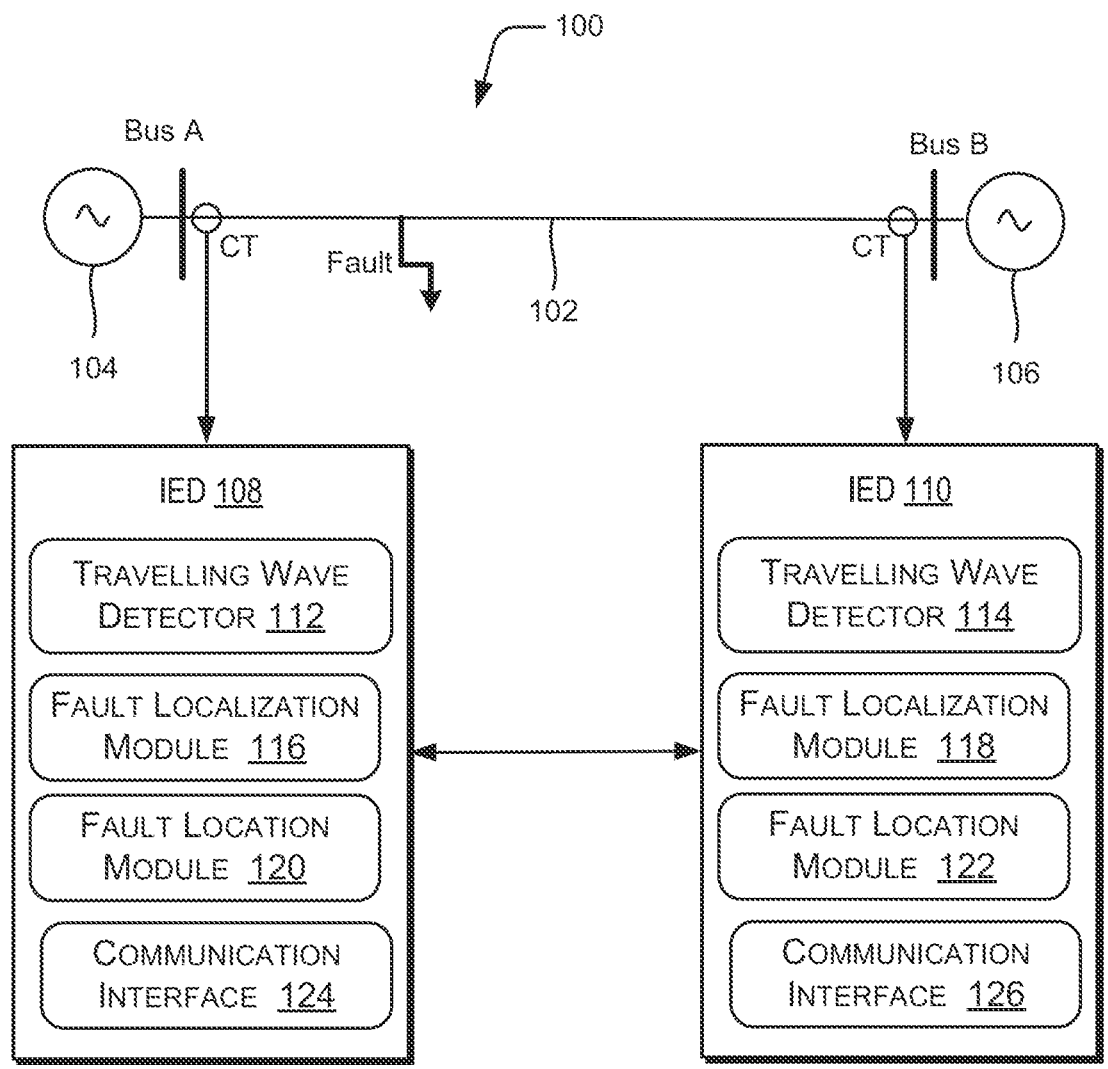
FIG. 1 illustrates a block diagram of a two-source equivalent electrical network for fault location, according to an example.

Based on the signal used, fault location techniques may be classified into two different categories: Techniques dependent on fundamental phasors of voltages and currents and techniques dependent on traveling waves generated by faults. Techniques dependent on fundamental phasors of voltages and currents are commonly known as impedance-based fault location methods. In the impedance-based fault location methods, fundamental phasor components of current and voltage signals are used by a fault locator to calculate the impedance of the faulted line. The calculated impedance is an approximate measure of the location of the fault. Impedance based method is largely employed by power utilities because of its ease of use, low sampling data and low hardware cost.

However, the precision of impedance-based fault location technique is adversely affected by the type of fault, arc resistance, angles of line and source impedances, phasor estimation technique, measurement transformer inaccuracies, current transformer (CT) saturation, power flow direction, and source to line impedance ratios (SIRs). Furthermore, impedance-based fault location techniques require the fundamental phasors of voltage and current to be precisely estimated which requires data set after a fault for 3 to 5 cycles and reliable phasor estimation techniques.

In addition, the impedance-based fault location methods depend on mutual coupling, non-homogeneity of the line and source impedances, source to line impedance ratio, fault resistance and fault loop information etc. With recent improvements in data acquisition and signal processing technology, traveling-wave fault locators are becoming more popular where higher accuracy is important. Traveling wave-based methods require only 2 to 3 millisecond (ms) data to locate the fault point and do not depend on the above-mentioned factors. Fault location using traveling waves can be estimated by multiplying the difference between time of arrival of incident and reflected waves and wave speed of the line.

Nowadays, the addition of renewable sources to the main power grid is anticipated to decrease overall inertia, especially with high solar photovoltaic generation integration to grid. This reduces the inertia constant and transient stability margin of the system which consequently reduces the critical clearing time of the relay to maintain stable operation of the grid. Thus, faster transmission line protection methods, such as time domain or traveling wave (TW) based methods are now being employed for fault location.

However, the fault location accuracy of double ended (two terminal) TW based methods depends on data synchronization, Intelligent Electronic Device (IED) hardware, software processing delay, and substation cable delay etc. The accuracy of TW based fault location method also depends on accuracy of the wave speed (line parameters). The wave speed and line length are not precise and are affected by many practical conditions such as weather, age of the conductor, temperature and sag etc. Hence, stated fault location accuracy of the conventional TW based technique may not be accurate.

The accuracy of the double ended TW based methods are reported as two tower distances (about 280 to 330 meters). For data synchronization in the double ended TW based methods, the Global Positioning System (GPS) based synchronization system uses an atomic clock for time distribution and provides high accuracy of synchronization. However, it suffers from several issues, such as error introduced by the atomic clock in GPS or offset leading to false timing signal and erroneous synchronization. The GPS system is affected by the dynamic nature of the environment as well as external disturbances, such as geomagnetic storm, radio jamming, electromagnetic interference from other devices, solar radio burst etc., leading to temporary or permanent failure in the functioning thereby resulting in poor data synchronization in the double ended TW based fault location techniques. Therefore, there may be a finite inaccuracy in synchronization between both ends of the IEDs and this can be of the order of few tens of microseconds ($\mu$s), consequently reducing the accuracy of the fault location.

Further, the copper substation cables laid to carry voltage and/or current signals from measurement devices to IED panels are different for each IED and these cables have different characteristics as well as lengths. Therefore, characteristics of one substation cable differs from characteristics of another substation cable, resulting in different propagation velocities. This may introduce a finite time shift of the order of 3-5 $\mu$s in the measurements carried out at the two terminals of the power transmission line, thereby introducing an error component in the fault location using double-ended TW based techniques.

Thus, total inaccuracy in data synchronization for the entire fault location (IED) system may be of the order of 30-50 $\mu$s which can result in 3 km to 5 km error in fault location for a 200 km transmission line using double-ended TW based methods. Sometimes, this delay may be calibrated and compensated through an algorithm by conducting experiments. However, this approach is cumbersome and costly as several field experiments are to be carried out manually to arrive at the reasonably correct calibration of parameters and calibration needs to be carried out periodically as physical conditions change over time. Thus, calibration and compensation of these errors in double-ended TW-based fault location techniques is expensive, time consuming and impractical.

In addition, fault location accuracy of TW based methods highly depend on the wave speed (inductance and capacitance per unit length of transmission line). The wave speed and line length are not precise and are affected by many practical conditions such as weather, age of the conductor, temperature and sag etc. Wave speed adjustment by creating faults at known distances may be performed. However, this requires an experiment to adjust the wave speed which is a time-consuming and expensive procedure. In some setting-free fault location methods both aerial and ground mode signals are necessary. The ground mode signals are highly attenuated and non-reliable, and available only for earth faults. Thus, such setting-free fault location methods may be employed only for earth faults.

The present disclosure relates to fault location independent of line parameters and data synchronization. Thus, fault location based on the approaches of the present disclosure, eliminates synchronization errors and errors introduced due to variations in wave velocity and line length resulting from variations in practical conditions such as weather, age of the conductor, temperature, sag etc. Further, the system and method of the present disclosure do not require experiments to calibrate the wave velocity for deployment of a fault location solution.

According to an example of the present disclosure, fault location in a power transmission line connecting a first terminal with a second terminal may be detected. There may be an electrical fault (or disturbance) at a particular location in the power transmission line. The fault may be identified from estimations based on measurements carried out at the first terminal and the second terminal. These measurements include current/voltage measurements carried out using measurement equipment. For example, the measurement equipment can include a current transformer, a potential transformer, a sensor-based measurement equipment (e.g. Rogowski coils, non-conventional instrument transformers etc.) and/or the like, which provides a signal corresponding to current, voltage or other information as sensed from the power transmission line.

Travelling waves are generated when there are faults in the power transmission line. Travelling wave is a temporary wave that creates a disturbance and moves along the power transmission line at a constant speed. Such type of wave occurs for a short duration (for a few microseconds) but may cause disturbance in the line.

According to an example of the present disclosure, a plurality of parameters associated with travelling waves detected from measurements carried out at the first and second terminals may be obtained. A travelling wave, and parameters thereof (e.g. arrival time, peak width, rise time etc.), can be detected from the measurements carried out at a terminal(s) (e.g. from the one or more signals received from the one or more measurement equipment). For example, a current signal may be digitized and processed to detect a travelling wave.

Travelling waves are generated due to the fault and can be detected from measurements at the first and second terminals. The plurality of parameters associated with the travelling wave detected from measurements at the first terminal are obtained and the plurality of parameters associated with the travelling wave detected from measurements at the second terminal are obtained. In an example, the measurements at the first terminal and the second terminal may be unsynchronized. For example, if two IEDs obtain the measurements, then the two IEDs (and/or corresponding measurement equipment) are unsynchronized in time.

For the travelling wave detected from measurements carried out at the first terminal, the arrival time of the first peak, the arrival time of the second peak, and the arrival time of the third peak are obtained. In an example, the first, second and third peaks correspond to first, second, and third crests of a current signal which is digitized and processed to detect the travelling wave at the first terminal. Similarly, for the travelling wave detected from measurements carried out at the second terminal, the arrival time of the first peak, the arrival time of the second peak, and the arrival time of the third peak are obtained. In an example, the first, second and third peaks correspond to first, second, and third crests of a current signal which is digitized and processed to detect the travelling wave at the second terminal.

Further, a rise time associated with the first peak of the travelling wave detected from the measurements carried out at the first terminal is estimated. Likewise, a rise time associated with the first peak of the travelling wave detected from the measurements carried out at the second terminal is estimated. Based on a comparison of the estimated rise times for the first peak of the travelling wave, one of a first half and a second half of the power transmission line, is identified as having a fault. Thus, the faulty half-section of the power transmission line is identified.

After identifying the faulty half-section, one of a first segment, a second segment, a third segment, and a fourth segment of the power transmission line is identified as having the fault, based on the identification of one of the first and the second half as having the fault, and a comparison of the arrival times of the first, second, and third peaks of the travelling wave. Further, lengths of the power transmission line is estimated based on identification of one of the first, second, third, and fourth segments as having the fault, a comparison of the arrival times of the first, second, and third peaks of the travelling wave, arrival time of a first peak of a travelling wave reflected from the second terminal detected from the measurements carried out at the first terminal, and arrival time of a first peak of a travelling wave reflected from the first terminal detected from the measurements carried out at the second terminal. An embodiment includes estimating the fault location based on the identification of one of the first, second, third, and fourth segments as having the fault, the arrival times of the first, second, and third peaks of the travelling wave detected from measurements carried out at the first and second terminals, and estimated lengths of the power transmission line.

Thus, the present disclosure enables accurate fault location using unsynchronized measurements for power transmission lines. Further, line parameters, such as, wave speed are not required for determining the fault location based on the techniques of the present disclosure. Also, fault location accuracy is independent of processing (hardware and software) delays. In addition, GPS for synchronization, is not required which reduces system complexity, delay, and cost. Further, the techniques of the present disclosure consume, lesser communication bandwidth than that consumed by the conventional techniques, as the technique of the present disclosure requires data of arrival times of only three peaks of the traveling wave to be transferred, thereby, eliminating the requirement of a complete disturbance recorder. Further, no experimental data/results are employed to correct the substation cable delay, software/hardware processing delays, and errors in wave speed. By dynamically estimating the lengths of the power transmission line based on arrival times associated with the first three peaks of the travelling wave, the dependence on data synchronization between the two terminals and dependence on line parameters may be eliminated in the fault location techniques of the present disclosure.

The following detailed description refers to the accompanying drawings. Wherever possible, the same reference numbers are used in the drawings and the following description to refer to the same or similar parts. While several examples are described in the description, modifications, adaptations, and other implementations are possible. Accordingly, the following detailed description does not limit the disclosed examples. Instead, the proper scope of the disclosed examples may be defined by the appended claims.

FIG. 1 illustrates a block diagram of a two-source equivalent electrical network 100 for fault location, according to an example. The electrical network 100 comprises a single power transmission line 102 and two-electrical sources, namely sources 104 and 106. The electrical network 100 may transmit electric power at high voltages, such as in the range of kilovolts, and for long distances, such as for tens or hundreds of kilometres.

The transmission line 102 is connected between two buses Bus A and Bus B, as shown in FIG. 1. The techniques of the present disclosure may be implemented with one or more devices associated with the power transmission line. The devices may include a power system device such as a relay, an Intelligent Electronic Device (IED) or fault locator, and/or a server connected with the power system devices. As shown in FIG. 1, an IED 108 is associated with Bus A, also referred to as first terminal and an IED 110 is associated with Bus B, also referred to as second terminal. The IEDs 108 and 110 may be in electrical communication with the transmission line 102 either directly or through other connecting means. As shown in FIG. 1, the IED 108 is placed at the Bus A (first terminal) and detects the travelling wave and obtains or estimates the required parameters/receives the parameters for fault location from other power system devices, such as the IED 110. The IED 110 is placed at the Bus B (second terminal) and detects the travelling wave and obtains or estimates the required parameters/receives the parameters for fault location from other power system devices, such as the IED 108. The IEDs 108 and 110, during operation, may receive data from one or more sensors and current transformers (CT) that may be installed within the electrical network 100.

For example, IED 108 at first terminal can obtain travelling wave related parameters from measurements at the first terminal and receive the travelling wave related measurements at the second terminal from IED 110. In this example, the IED 108 may receive a signal(s) from the measurement equipment, such as a current transformer (CT) at the first terminal and obtain measurements therefrom, or the measurement equipment publishes the measurements over a bus (e.g. process bus), and the IED (e.g. subscribed to receive data from such bus) receives the measurements over the bus. The travelling wave detection may alternately be performed at another power system device, and the obtained measurements (or parameters) may be communicated to the IEDs 108 or 110 or to a server implementing the method.

In an example, the steps of the method of the present disclosure may be performed by one or more modules. The modules may be implemented as instructions executable by one or more processors. For instance, in the example where the IEDs, such as the IEDs 108 and 110 perform the method, the modules are implemented with the processors of the IEDs 108 and 110. In other examples where a server performs the method, the modules may be implemented with the processor of the server. In case the method is implemented in part by an IED, and in part by the server, the modules (depending on the step) will be distributed accordingly in the IED and the server.

The IED 108 and 110 include travelling wave detectors 112 and 114, respectively. The travelling wave detectors 112 and 114 may be implemented as either software installed within the IEDs 108 and 110, or as hardware in the form of electronic circuitry. In an example, the travelling wave detectors 112 and 114 may be coupled with processor(s) of the IEDs 108 and 110. In another example, the travelling wave detector may be a standalone device (connected with the measurement equipment such as CT at Bus A or CT at Bus B).

Further, the IEDs 108 and 110 include fault localization modules 116 and 118, respectively, and fault location modules 120 and 122, respectively. The fault localization modules 116 and 118 and the fault location modules 120 and 122 may be implemented as either instruction executable by processor(s) of the IEDs 108 and 110, or as hardware in the form of electronic circuitry. Further, the IEDs 108 and 110 include communication interfaces 124 and 126. The communication interfaces 124 and 126 enable travelling wave related data to be exchanged between the IEDs 108 and 110 for fault location.

In operation, the travelling wave detector 112 of the IED 108 detects a first peak, a second peak, and a third peak of a travelling wave detected from measurements carried out at the first terminal (Bus A). Likewise, the travelling wave detector 114 of the IED 110 detects a first peak, a second peak, and a third peak of a travelling wave detected from measurements carried out at the second terminal (Bus B). Arrival times of the first peak, the second peak, and the third peak of the travelling wave detected from measurements carried out at the first terminal and the second terminal is obtained by the travelling wave detectors 112 and 114, respectively. Further, the travelling wave detectors 112 and 114, calculate a rise time associated with the first peak of the travelling wave detected from the measurements carried out at the first and second terminals.

Consider that $T_{ART}$ is the rise time of the first peak of the travelling wave detected from the measurements carried out at the first terminal and $T_{BRT}$ is the rise time of the first peak of the travelling wave detected from the measurements carried out at the second terminal. If $T_{ART}$ is less than $T_{BRT}$, the fault is identified to have occurred in the first half of the power transmission line, as illustrated in detail through the FIGS. 2a and 2b. If $T_{ART}$ is greater than $T_{BRT}$, the fault is identified to have occurred in the second half of the power transmission line, as illustrated in detail in through the FIGS. 2c and 2d.

Thus, $$\text{If, } T_{ART} < T_{BRT} \rightarrow \text{Fault is in first half of the line} \quad (1)$$

$$T_{ART} > T_{BRT} \rightarrow \text{Fault is in second half of the line} \quad (2)$$

Therefore, one of the first half and the second half of the power transmission line is identified, as having a fault, based on a comparison of the rise time estimated for the first peak of the travelling wave detected from the measurements carried out at the first and second terminals.

In the description, hereinafter, the modules and resources of the IED 108 have been referred to for implementing the functions of fault location, however, the modules and other resources of the IED 110 can be used mutatis mutandis to implement the functions of fault location. In response to identifying the first half of the power transmission line as having the fault, the fault localization module 116 determines a first difference between the arrival times of the peaks of the travelling wave detected from the measurements carried out at the first terminal (Bus A). The first difference ($t_{1diff}$) is the absolute difference between arrival times of two consecutive peaks among the first, second, and third peaks of the travelling wave.

$$\text{Thus, } t_{1diff} = \text{abs}((t_{A2} - t_{A1}) - (t_{A3} - t_{A2})) \quad (3)$$

where $t_{A1}$ represents the arrival time associated with the first peak of the traveling wave detected from the measurements carried out at the first terminal (Bus A);
$t_{A2}$ represents the arrival time associated with the second peak of the traveling wave detected from the measurements carried out at the first terminal (Bus A); and
$t_{A3}$ represents the arrival time associated with the third peak of the traveling wave detected from the measurements carried out at the first terminal (Bus A).

The fault localization module 116 identifies a first segment as having the fault, when the first difference is almost equal to zero. The first segment ranges from the first terminal (Bus A) to one third of the length of the power transmission line. The fault localization module 116 identifies a second segment as having the fault, when the first difference is greater than a predefined threshold. The second segment ranges from one third of the length of the power transmission line to half of the length of the power transmission line. Thus, $$t_{1diff} \to 0 \to \text{Fault is between first terminal and one-third of the line (first segment)} \quad (4)$$

$$t_{1diff} > \epsilon \to \text{Fault is between one-third and half of the line (second segment)} \quad (5)$$

Where $\epsilon$ is the predefined threshold which can be set as 2 μs for 1 MHz sampling frequency.

In response to identifying the second half of the power transmission line as having the fault, the fault localization module 116 determines a second difference between the arrival times of the peaks of the travelling wave detected from the measurements carried out at the second terminal (Bus B). In an example, the fault localization module 116 may obtain the arrival times of the peaks of the travelling wave detected from the measurements carried out at the second terminal from the IED 110 via the communication interface 126. The second difference ($t_{2diff}$) is the absolute difference between arrival times of two consecutive peaks among the first, second, and third peaks of the travelling wave detected from the measurements carried out at the second terminal.

$$\text{Thus, } t_{2diff} = \text{abs}((t_{B2} - t_{B1}) - (t_{B3} - t_{B2})) \quad (6)$$

where $t_{B1}$ represents the arrival time associated with the first peak of the traveling wave detected from the measurements carried out at the second terminal (Bus B);

$t_{B2}$ represents the arrival time associated with the second peak of the traveling wave detected from the measurements carried out at the second terminal (Bus B); and $t_{B3}$ represents the arrival time associated with the third peak of the traveling wave detected from the measurements carried out at the second terminal (Bus B).

The fault localization module 116 identifies a third segment as having the fault, when the second difference is greater that a predefined threshold. The third segment ranges from half of the length of the power transmission line to two third of the length of the power transmission line. The fault localization module 116 identifies a fourth segment as having the fault, when the second difference is almost equal to zero. The fourth segment ranges from two third of the length of the power transmission line to the second terminal (Bus B). Thus, $$t_{2diff} > \epsilon \to \text{Fault is between half and two-third of the line (third segment)} \quad (7)$$

$$t_{2diff} \to 0 \to \text{Fault is between two-third of the line and second terminal (fourth segment)} \quad (8)$$

Where $\epsilon$ is the predefined threshold which can be set as 2 μs for 1 MHz sampling frequency.

Figure 2A:
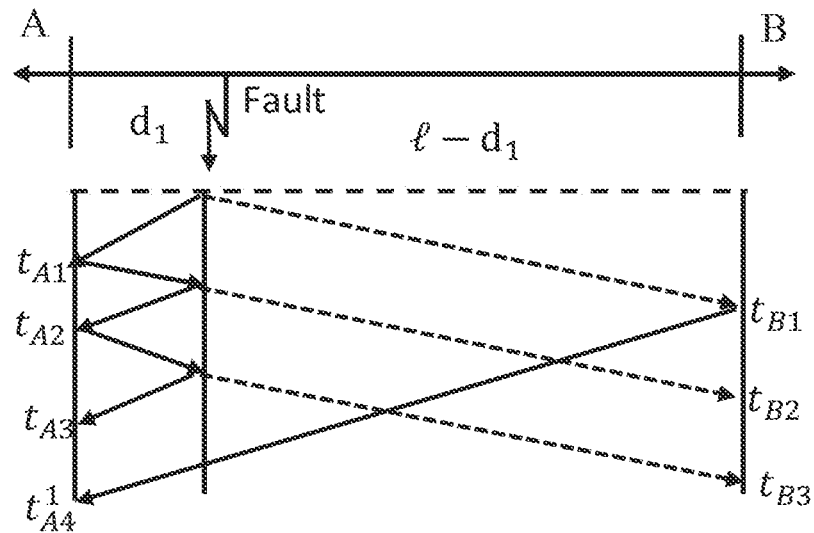
FIGS. 2a, 2b, 2c, and 2d show Bewley lattice diagrams for faults in first, second, third, and fourth segments of a power transmission line, according to examples.

FIG. 2a shows a Bewley lattice diagram for a scenario when the fault has occurred in the first segment of the power transmission line, i.e., between the first terminal (Bus A side) and one-third of the length of the power transmission line. In this scenario, at the first terminal (Bus A side), for travelling wave generated from the fault point, the first peak, the second peak, and the third peak arrived from the fault point (i.e. not as a reflection from Bus B-side). At Bus B side, for travelling wave generated from the fault point, the first peak arrived from fault point, and the second peak arrived from far end bus (i.e. from Bus A side) as a result of a reflected wave, as shown. Similarly, at Bus A side, for travelling wave generated from the fault point, the first reflected wave is received after time $t_{A4}^1$. The fault location can be calculated as follows. From FIG. 2a Bewley lattice diagram, we can write:

$$t_{A1} = t_{A0} + \frac{d_1}{v}; \quad t_{A2} = t_{A0} + \frac{3d_1}{v}; \quad t_{A3} = t_{A0} + \frac{5d_1}{v}; \quad (9)$$

Where $t_{A0}$ represents fault inception time at first terminal (Bus A side), $d_1$ represents fault distance from the first terminal (Bus A side) for faults in the first segment, and $v$ represents wave speed.

The fault location can be calculated as in equation (10) below using first two traveling wave arrival times of equation (9), $$d_1 = [(t_{A2} - t_{A1})]\frac{v}{2} \quad (10)$$

In this scenario, the line length cannot be estimated using equation (1), because there is no remote reflection or none of the wave traverses entire length of the power transmission line. To overcome this, the first remote reflection arrival time at the first terminal (Bus A side) from remote terminal B may be recorded. Thus, the first peak of the travelling wave reflected from the second terminal (Bus B side) detected from the measurements carried out at the first terminal (Bus A side) is represented as $t_{A3}^1$.

Thus $$t_{A4}^1 = t_{A0} + \frac{2\ell - d_1}{v}, \quad (11)$$

where $\ell$ represents the true length of the power transmission line; and From the equations (9) and (11), the first estimated length ($\ell_{1\_est}$) of the power transmission line may be expressed as below.

$$\ell_{1\_est} = [(t_{A2} - t_{A1}) + (t_{A4}^1 - t_{A2})]\frac{v}{2} \quad (12)$$

Where, $\ell_{1\_est}$ represents a first estimated length of the power transmission line for the fault identified to be in the first segment.

In response to identifying the first segment as having the fault, the fault location module 120, calculates the first estimated length of the power transmission line based on equation (12). As can be seen from equation (12), the first estimated length is proportional to a sum of the difference between the arrival times of the first and second peaks of the travelling wave detected from the measurements carried out at the first terminal (Bus A side) and the difference between arrival times of the first peak of the travelling wave reflected from the second terminal (Bus B side) and the second peak of the travelling wave detected from the measurements carried out at the first terminal (Bus A side).

Based on the equations (10) and (12), the per unit fault location ($d_{1\_pu}$) can obtained as in equation (13) below, for faults identified to be in the first segment of the power transmission line. The fault location ($d_{1\_pu}$) is fault location per unit length.

$$d_{1\_pu} = \frac{d_1}{\ell_{1\_est}} = \frac{(t_{A2} - t_{A1})}{(t_{A2} - t_{A1}) + (t_{A4}^1 - t_{A1})} \quad (13)$$

Thus, the fault location module 120, estimates the fault location in the first segment of the power transmission line from a ratio of a difference between the arrival times of the second and first peaks of the travelling wave detected from measurements carried out at the first terminal (Bus A side) to the first estimated length, as shown in equation (13).

Figure 2B:
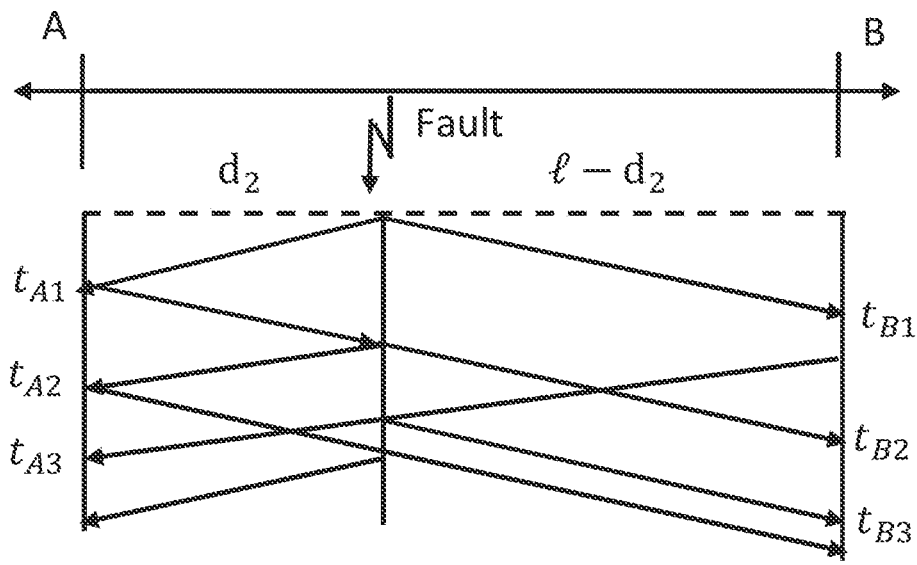

FIG. 2b shows a Bewley lattice diagram for a scenario when the fault has occurred in the second segment of the power transmission line, i.e., between one-third and half of the length of the power transmission line. The fault location can be calculated as follows. From FIG. 2b Bewley lattice diagram, we can write:

$$t_{A1} = t_{A0} + \frac{d_2}{v}; \quad t_{A2} = t_{A0} + \frac{3d_2}{v}; \quad t_{A3} = t_{A0} + \frac{2\ell - d_2}{v} \quad (14)$$

Where, $t_{A0}$ represents fault inception time at first terminal (Bus A side), $d_2$ represents fault distance from the first terminal (Bus A side) for faults in the second segment, $\ell$ represents the true length of the power transmission line, and v represents wave speed.

The fault location can be calculated as in equation (15) below using first two traveling wave arrival times of equation (14).

$$d_2 = [(t_{A2} - t_{A1})]\frac{v}{2} \quad (15)$$

From the equations (14) and (15), the second estimated length ($\ell_{2\_est}$) of the power transmission line may be expressed as below in equation (16).

$$\ell_{2\_est} = [(t_{A3} + t_{A2} - 2t_{A1})]\frac{v}{2} \quad (16)$$

Where, $\ell_{2\_est}$ represents a second estimated length of the power transmission line for the fault identified to be in the second segment.

In response to identifying the second segment as having the fault, the fault location module 120, estimates the second estimated length of the power transmission line based on equation (16). As can be seen from equation (16), the second estimated length is proportional to the difference between a sum of the arrival times of the second and third peaks of the travelling wave detected from the measurements carried out at the first terminal (Bus A side) and twice the arrival time of the first peak detected from the measurements carried out at the first terminal (Bus A side).

Based on the equations (15) and (16), the fault location ($d_{2\_pu}$) can obtained as in equation (17) below, for faults identified to be in the second segment of the power transmission line. The fault location ($d_{2\_pu}$) is fault location per unit length.

$$d_{2\_pu} = \frac{d_2}{\ell_{2\_est}} = \frac{(t_{A2} - t_{A1})}{t_{A3} + t_{A2} - 2t_{A1}} \quad (17)$$

Thus, the fault location module 120, estimates the fault location in the second segment of the power transmission line from a ratio of a difference between the arrival times of the second and first peaks of the travelling wave detected from measurements carried out at the first terminal (Bus A side) to the second estimated length, as shown in equation (17).

Figure 2C:
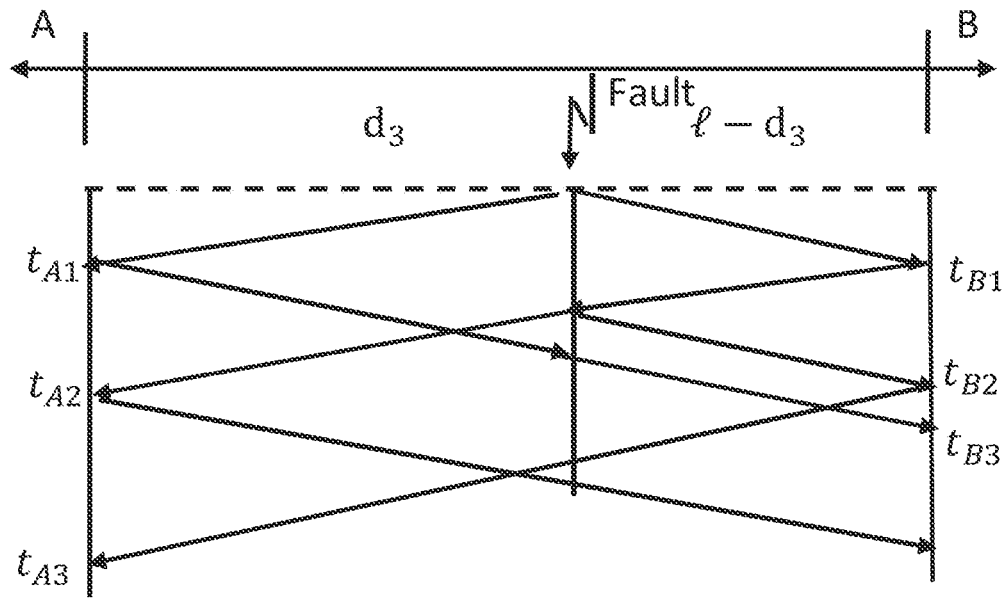

FIG. 2c shows a Bewley lattice diagram for a scenario when the fault has occurred in the third segment of the power transmission line, i.e., between half and two-third of the length of the power transmission line. The fault location can be calculated as follows. From FIG. 2c Bewley lattice diagram, we can write:

$$t_{A1} = t_{A0} + \frac{d_3}{V}; \quad t_{A2} = t_{A0} + \frac{2\ell - d_3}{V}; \quad t_{A3} = t_{A0} + \frac{3d_3}{V} \quad (18)$$

where $t_{A0}$ represents fault inception time at first terminal (Bus A side), $d_3$ represents fault distance from the first terminal (Bus A side) for faults in the third segment, $\ell$ represents the true length of the power transmission line, and v represents wave speed. The fault location can be calculated as in equation (19) below using first two traveling wave arrival times of equation (18).

$$d_3 = \ell - [(t_{A2} - t_{A1})]\frac{v}{2} \quad (19)$$

In response to identifying the third segment as having the fault, the fault location module 120, estimates the second estimated length of the power transmission line based on equation (16). As can be seen from equation (16), the second estimated length is proportional to the difference between a sum of the arrival times of the second and third peaks of the travelling wave detected from the measurements carried out at the first terminal (Bus A side) and twice the arrival time of the first peak detected from the measurements carried out at the first terminal (Bus A side).

Based on the equations (19) and (16), the fault location ($d_{3\_pu}$) can obtained as in equation (20) below, for faults identified to be in the third segment of the power transmission line. The fault location ($d_{3\_pu}$) is expressed in terms of fault location per unit length.

$$d_{3\_pu} = \frac{d_2}{\ell_{2\_est}} = \frac{(t_{A3} - t_{A1})}{t_{A3} + t_{A2} - 2t_{A1}} \quad (20)$$

Thus, the fault location module 120, estimates the fault location in the second segment of the power transmission line from a ratio of a difference between the arrival times of the third and first peaks of the travelling wave detected from measurements carried out at the first terminal (Bus A side) to the second estimated length, as shown in equation (20).

Figure 2D:
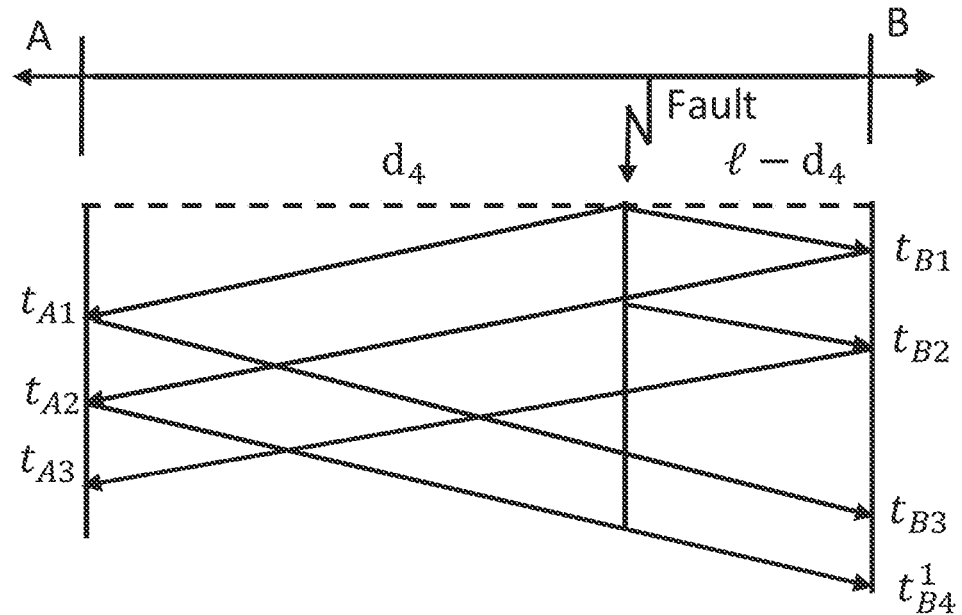

FIG. 2d shows a Bewley lattice diagram for a scenario when the fault has occurred in the fourth segment of the power transmission line, i.e., between two-third of the length of the power transmission line and the second terminal (Bus B side).

The fault location can be calculated as follows. From FIG. 2d Bewley lattice diagram, we can write from the first terminal:

$$t_{A1} = t_{A0} + \frac{d_4}{V}; \; t_{A2} = t_{A0} + \frac{2\ell - d_4}{V}; \; t_{A3} = t_{A0} + \frac{4\ell - 3d_4}{V} \quad (21)$$

where $t_{A0}$ represents fault inception time at first terminal (Bus A side), $d_4$ represents fault distance from the first terminal (Bus A side) for faults in the fourth segment, $\ell$ represents the true length of the power transmission line, and v represents wave speed.

From FIG. 2d Bewley lattice diagram, we can write from the second terminal:

$$t_{B1} = t_{B0} + \frac{\ell - d_4}{V}; \; t_{B2} = t_{B0} + \frac{3(\ell - d_4)}{V}; \; t_{B3} = t_{B0} + \frac{5(\ell - d_4)}{V} \quad (22)$$

where $t_{B0}$ represents fault inception time at Second terminal (Bus B side).

The fault location can be calculated as in equation (22) below using first two traveling wave arrival times of equation (21), $$d_4 = \ell - [(t_{A2} - t_{A1})]\frac{v}{2} \quad (23)$$

In this scenario, the line length cannot be estimated using equation (21), because there is no remote reflection from the first terminal (Bus A side) of the power transmission line. To overcome this, the first remote reflection arrival time at the second terminal (Bus B side) from remote first terminal (Bus A side) may be recorded. Thus, the first peak of the travelling wave reflected from the first terminal (Bus A side) detected from the measurements carried out at the second terminal (Bus B side) is represented as $t_{B4}^1$.

Thus, $$t_{B4}^1 = t_{B0} + \frac{\ell - d_4}{v} \quad (24)$$

From the equations (22) and (23), the third estimated length ($\ell_{3\_est}$) of the power transmission line may be expressed as below.

$$\ell_{3\_est} = [(t_{B2} - t_{B1}) + (t_{B4}^1 - t_{B2})]\frac{v}{2} \quad (25)$$

Where, $\ell_{3\_est}$ represents a third estimated length of the power transmission line for the fault identified to be in the fourth segment.

In response to identifying the fourth segment as having the fault, the fault location module 120, estimates the third estimated length of the power transmission line based on equation (25). As can be seen from equation (25), the third estimated length is proportional to the sum of a difference between the arrival times of the first and second peaks of the travelling wave detected from the measurements carried out at the second terminal (Bus B side) and a difference between arrival times of the first peak of the travelling wave reflected from the first terminal (Bus A side) and the second peak of the travelling wave detected from the measurements carried out at the second terminal (Bus B side).

Based on the equations (23) and (24), the fault location ($d_{4\_pu}$) can obtained as in equation (25) below, for faults identified to be in the fourth segment of the power transmission line. The fault location ($d_{4\_pu}$) is fault location per unit length.

$$d_{4\_pu} = \frac{d_4}{\ell_{3\_est}} = \frac{(t_{B2} - t_{B1}) + (t_{B4}^1 - t_{B2}) - (t_{A2} - t_{A1})}{(t_{B2} - t_{B1}) + (t_{B4}^1 - t_{B2})} \quad (26)$$

Thus, the fault location module 120, estimates the fault location in the fourth segment of the power transmission line from a ratio of a sum of the difference between the arrival times of the first and second peaks of the travelling wave detected from the measurements carried out at the second terminal (Bus B side) and a difference between the arrival times of the first peak of the travelling wave reflected from the first terminal and the second peak of the travelling wave detected from the measurements carried out at the second terminal (Bus B side) to the third estimated length, as shown in equation (26).

Figure 3A:
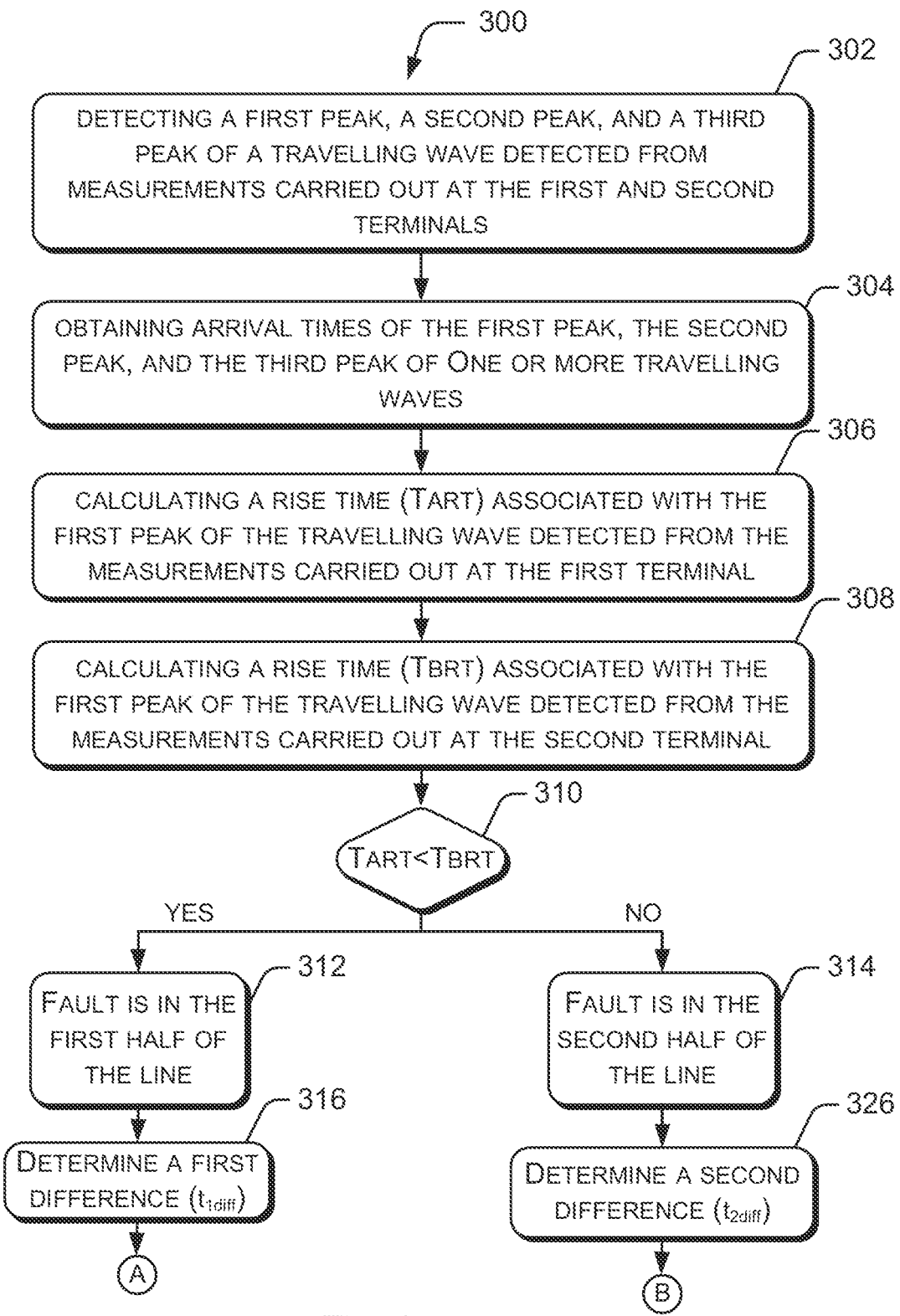
FIGS. 3a and 3b represent a method for fault location in the power transmission line, according to an example.
Figure 3B:
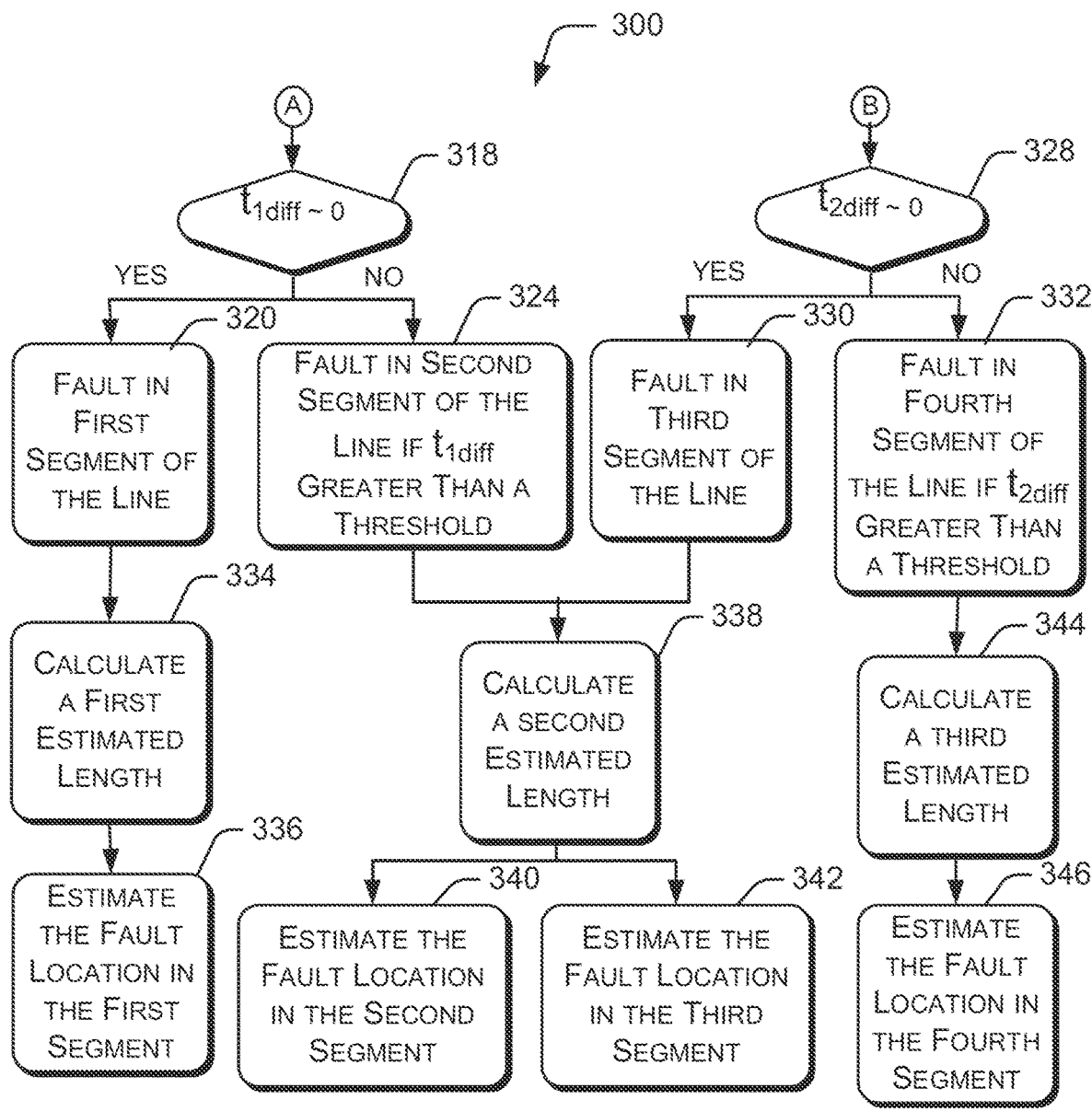

FIGS. 3a and 3b illustrate a method 300 for fault location in the power transmission line, according to an example. The method 300 may be executed by a device, such as the IED 108 or 110. The method 300 can be implemented by processing resource(s) or electrical control systems through any suitable hardware, programmable instructions, or combination thereof. In an example, step(s) of the method 300 may be performed by hardware or programming modules, such as the travelling wave detector 112 or 114 fault localization module 116 or 118, and the fault location module 120 or 122. Further, although the method 300 is described in context of the aforementioned IEDs 108 and 110, a server or other suitable systems may be used for execution of the method 300. It may be understood that processes involved in the method 300 can be executed based on instructions stored in a non-transitory computer-readable medium. The non-transitory computer-readable medium may include, for example, digital memories, magnetic storage media, such as a magnetic disks and magnetic tapes, hard drives, or optically readable digital data storage media.

Referring to FIG. 3A, measurements associated with travelling waves at each terminal (Bus A side and Bus B side) of a power transmission line is received. In an example, the terminal may be a bus, such as the bus A or B of FIG. 1 and the power transmission line may be the power transmission line 102 shown in FIG. 1 to which an IED, such as the IEDs 108 or 110, is coupled. At block 302, a first peak, a second peak, and a third peak of the travelling wave detected from the measurements carried out at the first and second terminals are detected.

At block 304, the arrival times of the first peak, the second peak, and the third peak of the travelling wave detected from measurements carried out at the first and second terminals are obtained. In an example, the arrival times may be measured by measurement equipment, such as a CT or PT, etc., at the first and second terminals and the same may be communicated to the IEDs 108 and 110. In an example, with reference to FIG. 1, the IED 108 may receive the measurements of arrival times of the first, second, and third peaks of the travelling wave detected from measurements carried out at the second terminal (Bus B side) via a communication link between the IEDs 108 and 110, and vice versa. Thus, each intelligent electronic device, such as the IED 108 or 110, associated with one of the first and the second terminals, receives the measurements carried out at each of the first and second terminals from at least one of a measurement equipment and communication interface associated with each of the first and second terminals.

At block 306, calculate a rise time ($T_{ART}$) associated with the first peak of the travelling wave detected from the measurements carried out at the first terminal is calculated. Similarly, a rise time ($T_{BRT}$) associated with the first peak of the travelling wave detected from the measurements carried out at the second terminal is calculated, at block 308. $T_{ART}$ represents the rise time of the first peak of the travelling wave detected from the measurements carried out at the first terminal (Bus A side) and $T_{BRT}$ is the rise time of the first peak of the travelling wave detected from the measurements carried out at the second terminal (Bus B side).

A comparison of $T_{ART}$ and $T_{BRT}$ is carried out at block 310. At block 312, the fault is identified in the first half of the power transmission line if $T_{ART}$ is less than $T_{BRT}$ ('Yes' branch from block 310). At block 314, the fault is identified in the second half of the power transmission line if $T_{ART}$ is greater than $T_{BRT}$ ('No' branch from block 310).

In response to identifying the first half of the power transmission line as having the fault, a first difference between the arrival times of the peaks of the travelling wave detected from the measurements carried out at the first terminal (Bus A side) is determined, at block 316. The first difference ($t_{1diff}$) is the absolute difference between arrival times of two consecutive peaks among the first, second, and third peaks of the travelling wave, as expressed by equation (3).

At block 318, it is checked whether first difference ($t_{1diff}$) is almost equals to zero. At block 320, a first segment is identified as having the fault, when the first difference is almost equals to zero ('YES' branch from block 318). The first segment ranges from the first terminal (Bus A) to one third of the length of the power transmission line. At block 324, a second segment is identified as having the fault, when the first difference is greater that a predefined threshold. The second segment ranges from one third of the length of the power transmission line to half of the length of the power transmission line. Identification of the first and second segments is based on the equations (4) and (5).

In response to identifying the second half of the power transmission line as having the fault, a second difference between the arrival times of the peaks of the travelling wave detected from the measurements carried out at the second terminal (Bus B) is detected, at block 326. The second difference ($t_{2diff}$) is the absolute difference between arrival times of two consecutive peaks among the first, second, and third peaks of the travelling wave detected from the measurements carried out at the second terminal, as expressed by equation (6).

At block 328, it is checked whether the second difference is almost equal to zero. At block 330, a third segment is identified as having the fault, when the second difference is almost equals to zero. The third segment ranges from half of the length of the power transmission line to two third of the length of the power transmission line. At block 332, a fourth segment is identified as having the fault, when the second difference is greater that a predefined threshold. The fourth segment ranges from two third of the length of the power transmission line to the second terminal (Bus B). Identification of the third and fourth segments is based on the equations (7) and (8).

In response to identifying the first segment as having the fault, a first estimated length of the power transmission line is calculated based on equation (12), at block 334. As can be seen from equation (12), the first estimated length is proportional to a sum of the difference between the arrival times of the first and second peaks of the travelling wave detected from the measurements carried out at the first terminal (Bus A side) and the difference between arrival times of the first peak of the travelling wave reflected from the second terminal (Bus B side) and the second peak of the travelling wave detected from the measurements carried out at the first terminal (Bus A side).

Based on the equations (10) and (12), the fault location ($d_{1\_pu}$) can obtained as in equation (13), for faults identified to be in the first segment of the power transmission line. The fault location ($d_{1\_pu}$) is expressed in terms of fault location per unit length. Thus, at block 336, the fault location in the first segment of the power transmission line is estimated from a ratio of a difference between the arrival times of the second and first peaks of the travelling wave detected from measurements carried out at the first terminal (Bus A side) to the first estimated length, as shown in equation (13).

In response to identifying the second segment or the third segment as having the fault at blocks 324 and 330, a second estimated length of the power transmission line is calculated based on equation (16), at block 338. As can be seen from equation (16), the second estimated length is proportional to the difference between a sum of the arrival times of the second and third peaks of the travelling wave detected from the measurements carried out at the first terminal (Bus A side) and twice the arrival time of the first peak detected from the measurements carried out at the first terminal (Bus A side).

Based on the equations (15) and (16), the fault location ($d_{2\_pu}$) can obtained as in equation (17), for faults identified to be in the second segment of the power transmission line. The fault location ($d_{2\_pu}$) is expressed in terms of fault location per unit length. Thus, at block 340, the fault location in the second segment of the power transmission line is estimated from a ratio of a difference between the arrival times of the second and first peaks of the travelling wave detected from measurements carried out at the first terminal (Bus A side) to the second estimated length, as shown in equation (17).

Based on the equations (19) and (16), the fault location ($d_{3\_pu}$) can obtained as in equation (20), for faults identified to be in the third segment of the power transmission line. The fault location ($d_{3\_pu}$) is expressed in terms of fault location per unit length. Thus, at block 342, the fault location in the third segment of the power transmission line may be estimates from a ratio of a difference between the arrival times of the third and first peaks of the travelling wave detected from measurements carried out at the first terminal (Bus A side) to the second estimated length, as shown in equation (20).

In response to identifying the fourth segment as having the fault, a third estimated length of the power transmission line is calculated based on equation (24), at block 344. As can be seen from equation (24), the third estimated length is proportional to the sum of a difference between the arrival times of the first and second peaks of the travelling wave detected from the measurements carried out at the second terminal (Bus B side) and a difference between arrival times of the first peak of the travelling wave reflected from the first terminal (Bus A side) and the second peak of the travelling wave detected from the measurements carried out at the second terminal (Bus B side).

Based on the equations (24) and (25), the fault location ($d_{4\_pu}$) can obtained as in equation (26), for faults identified to be in the fourth segment of the power transmission line. The fault location ($d_{4\_pu}$) is expressed in terms of fault location per unit length. Thus, at block 346, the fault location in the fourth segment of the power transmission line is estimated from a ratio of a sum of the difference between the arrival times of the first and second peaks of the travelling wave detected from the measurements carried out at the second terminal (Bus B side) and a difference between the arrival times of the first peak of the travelling wave reflected from the first terminal and the second peak of the travelling wave detected from the measurements carried out at the second terminal (Bus B side) to the third estimated length, as shown in equation (25).

The methods and devices of the proposed embodiments are tested to establish the technical feasibility. In an example, the simulation results on a system consisting of transmission line of length 200 km is discussed below to establish the techniques of the present disclosure. In the example, four cases covering all the segments (first, second, third, and fourth) of the power transmission line are considered to test the accuracy of the present embodiments.

| Case | Fault Location (km) | Segment of the transmission line in which fault has occurred |
|---|---|---|
| 1 | 50 | First segment |
| 2 | 90 | Second segment |
| 3 | 110 | Third segment |
| 4 | 150 | Fourth segment |

The test cases include different fault locations at 50, 90, 110 and 150 km from the first terminal (Bus A side) and with data synchronization and wave speed error. It can be observed from Table I, illustrated in FIGS. 4a and 4b, that even for small errors in time synchronization (for example 1 µs), accuracy of conventional fault location techniques is affected significantly. However, the methods and devices of the present disclosure maintain their accuracy even with higher synchronization errors.

The method of the present disclosure is also tested for varying wave speed variation from 0.5% to 10%. Using the conventional methods, it is observed that error increased significantly for faults in first and fourth segments while using the method of the present disclosure, accuracy is not affected. The results are tabulated in the Table II, illustrated in FIGS. 5a and 5b.

Based on the above results, it may be concluded that the present embodiments relating to parameter independent traveling wave-based fault location using unsynchronized measurements are more accurate as compared to the conventional techniques of fault location. The method of the present disclosure is also validated for different synchronization and wave speed errors. For conventional two-terminal methods, fault location error increases for higher synchronization and wave speed errors whereas accuracy of the method of the present disclosure is consistent and independent of the data synchronization and wave speed errors. Test results on fault location reveal that the method of the present disclosure is unaffected by the location of the fault, fault type, arc resistances, fault inception angles, measurement noises and non-linear high impedance faults. According to simulation results, it is possible to achieve a fault location accuracy of ±150 m for the test system using 200 km line. Although derivations and simulations are carried out for an AC transmission line, the concept can be extended to DC transmission lines also. In an example, the present embodiments can be implemented in IEDs and require neither GPS based synchronization nor field experiments for tuning different component and wave speed (line parameters) errors resulting in cost savings during practical deployments.

Although implementations of present subject matter have been described in language specific to structural features and/or methods, it is to be noted that the present subject matter is not necessarily limited to the specific features or methods described. Rather, the specific features and methods are disclosed and explained in the context of a few implementations for the present subject matter.

The invention claimed is:

1. A method for fault location in a power transmission line connecting a first terminal with a second terminal, the method comprising:
    obtaining arrival times of a first peak, a second peak, and a third peak of a travelling wave detected from measurements carried out at each of the first and second terminals;
    calculating a rise time associated with the first peak of the travelling wave detected from the measurements carried out at the first and second terminals;
    identifying one of a first half and a second half of the power transmission line, as having a fault, based on a comparison of the rise time estimated for the first peak of the travelling wave at the first and second terminals;
    identifying one of a first segment, a second segment, a third segment, and a fourth segment of the power transmission line as having the fault, based on the identification of one of the first and the second half as having the fault, and a comparison of the arrival times of the first, second, and third peaks of the travelling wave at the first and second terminals;
    estimating lengths of the power transmission line based on identification of one of the first, second, third, and fourth segments as having the fault, a comparison of the arrival times of the first, second, and third peaks of the travelling wave, arrival time of a first peak of a travelling wave reflected from the second terminal detected from the measurements carried out at the first terminal, and arrival time of a first peak of a travelling wave reflected from the first terminal detected from the measurements carried out at the second terminal; and
    estimating the fault location based on the identification of one of the first, second, third, and fourth segments as having the fault, the arrival times of the first, second, and third peaks of the travelling wave detected from measurements carried out at the first and second terminals, and estimated lengths of the power transmission line.

2. The method as claimed in claim 1, wherein the fault is identified in the first half of the power transmission line if $T_{ART}$ is less than $T_{BRT}$, and the fault is identified in the second half of the power transmission line if $T_{ART}$ is greater than $T_{BRT}$, wherein $T_{ART}$ is the rise time of the first peak of the travelling wave detected from the measurements carried out at the first terminal, and $T_{BRT}$ is the rise time of the first peak of the travelling wave detected from the measurements carried out at the second terminal.

3. A method for fault location in a power transmission line connecting to a first terminal with a second terminal, the method comprising:
    obtaining arrival times of a first peak, a second peak, and a third peak of a travelling wave detected from measurements carried out at each of the first and second terminals;

calculating a rise time associated with the first peak of the travelling wave detected from the measurements carried out at the first and second terminals;

identifying one of a first half and a second half of the power transmission line, as having a fault, based on a comparison of the rise time estimated for the first peak of the travelling wave at the first and second terminals;

identifying one of a first segment, a second segment, a third segment, and a fourth segment of the power transmission line as having the fault, based on the identification of one of the first and the second half as having the fault, and a comparison of the arrival times of the first, second, and third peaks of the travelling wave at the first and second terminals, wherein identifying one of the first, second, third, and fourth segments of the power transmission line, as having the fault comprises:

in response to identifying the first half of the power transmission line as having the fault determining a first difference between the arrival times, wherein the first difference is the absolute difference between arrival times of two consecutive peaks among the first, second, and third peaks of the travelling wave detected from the measurements carried out at the second terminal, identifying the first segment as having the fault, when the first difference is almost equals to zero, wherein the first segment ranges from the first terminal to one third of the length of the power transmission line, and identifying the second segment as having the fault, when the first difference is greater that a predefined threshold, wherein the second segment ranges from one third of the length of the power transmission line to half of the length of the power transmission line, and in response to identifying the second half of the power transmission line as having the fault determining a second difference between the arrival times, wherein the second difference is the absolute difference between arrival times of two consecutive peaks among the first, second, and third peaks of the travelling wave detected from the measurements carried out at the second terminal, identifying the third segment as having the fault, when the second difference is greater that the predefined threshold, wherein the third segment ranges from half of the length of the power transmission line to two third of the length of the power transmission line, and identifying the fourth segment as having the fault, when the second difference is almost equals to zero, wherein the fourth segment ranges from two third of the length of the power transmission line to the second terminal;

estimating lengths of the power transmission line based on identification of one of the first, second, third, and fourth segments as having the fault, a comparison of the arrival times of the first, second, and third peaks of the travelling wave, arrival time of a first peak of a travelling wave reflected from the second terminal detected from the measurements carried out at the first terminal, and arrival time of a first peak of a travelling wave reflected from the first terminal detected from the measurements carried out at the second terminal; and estimating the fault location based on the identification of one of the first, second, third, and fourth segments as having the fault, the arrival times of the first, second, and third peaks of the travelling wave detected from measurements carried out at the first and second terminals, and estimated lengths of the power transmission line.

4. The method as claimed in claim 3, wherein estimating lengths of the power transmission line comprises:

in response to identifying the first segment as having the fault, calculating a first estimated length of the power transmission line proportional to a sum of the difference between the arrival times of the first and second peaks of the travelling wave detected from the measurements carried out at the first terminal and the difference between arrival times of the first peak of the travelling wave reflected from the second terminal and the second peak of the travelling wave detected from the measurements carried out at the first terminal;

in response to identifying one of the second segment and the third segment as having the fault, calculating a second estimated length of the power transmission line proportional to the difference between a sum of the arrival times of the second and third peaks of the travelling wave detected from the measurements carried out at the first terminal and twice the arrival time of the first peak detected from the measurements carried out at the first terminal; and in response to identifying the fourth segment as having the fault, calculating a third estimated length of the power transmission line proportional to the sum of a difference between the arrival times of the first and second peaks of the travelling wave detected from the measurements carried out at the second terminal and a difference between the arrival times of the first peak of the travelling wave reflected from the first terminal and the second peak of the travelling wave detected from the measurements carried out at the second terminal.

5. The method as claimed in claim 4, wherein the fault location in the first segment of the power transmission line is estimated from a ratio of a difference between the arrival times of the second and first peaks of the travelling wave detected from measurements carried out at the first terminal to the first estimated length and expressed in terms of fault location per unit length.

6. The method as claimed in claim 4, wherein the fault location in the second segment of the power transmission line is estimated from a ratio of a difference between the arrival times of the second and first peaks of the travelling wave detected from measurements carried out at the first terminal to the second estimated length and expressed in terms of fault location per unit length.

7. The method as claimed in claim 4, wherein the fault location in the third segment of the power transmission line is estimated from a ratio of a difference between the arrival times of the third and first peaks of the travelling wave detected from measurements carried out at the first terminal to the second estimated length and expressed in terms of fault location per unit length.

8. The method as claimed in claim 4, wherein the fault location in the fourth segment of the power transmission line is estimated from a ratio of a sum of the difference between the arrival times of the first and second peaks of the travelling wave detected from the measurements carried out at the second terminal and a difference between the arrival times of the first peak of the travelling wave reflected from the first terminal and the second peak of the travelling wave detected from the measurements carried out at the second terminal to the third estimated length and expressed in terms of fault location per unit length.

9. A device for fault location in a power transmission line connecting a first terminal with a second terminal, the device comprising:
   a travelling wave detector to:
      detect a first peak, a second peak, and a third peak of a travelling wave detected from measurements carried out at the first and second terminals;
      obtain arrival times of the first peak, the second peak, and the third peak of the travelling wave detected from measurements carried out at the first and second terminals; and
      calculate a rise time associated with the first peak of the travelling wave detected from the measurements carried out at the first and second terminals;
   a fault localization module configured to:
      identify one of a first half and a second half of the power transmission line, as having a fault, based on a comparison of the calculated rise time associated with the first peak of the travelling wave;
      identify one of a first segment, a second segment, a third segment, and a fourth segment of the power transmission line as having the fault, based on the identification of one of the first and the second half as having the fault, and a comparison of the arrival times of the first, second, and third peaks of the travelling wave;
   a fault location module coupled to the processor to:
      estimate lengths of the power transmission line based on identification of one of the first, second, third, and fourth segments as having the fault, a comparison of the arrival times of the first, second, and third peaks of the travelling wave, arrival time of a first peak of a travelling wave reflected from the second terminal detected from the measurements carried out at the first terminal, and arrival time of a first peak of a travelling wave reflected from the first terminal detected from the measurements carried out at the second terminal; and
      estimate the fault location based on the identification of one of the first, second, third, and fourth segments as having the fault, the arrival times of the first, second, and third peaks of the travelling wave detected from measurements carried out at the first and second terminals, and estimated lengths of the power transmission line.

10. The device as claimed in claim 9, wherein the device is an intelligent electronic device associated with one of the first and the second terminal, and wherein the device receives the measurements carried out at each of the first and second terminals from at least one of a measurement equipment and communication interface associated with each of the first and second terminals.

11. A method for fault location in a power transmission line connecting to a first terminal with a second terminal, the method comprising:
   obtaining arrival times of a first peak, a second peak, and a third peak of a travelling wave detected from measurements carried out at each of the first and second terminals;
   calculating a rise time associated with the first peak of the travelling wave detected from the measurements carried out at the first and second terminals;
   identifying one of a first half and a second half of the power transmission line, as having a fault, based on a comparison of the rise time estimated for the first peak of the travelling wave at the first and second terminals;
   identifying one of a first segment, a second segment, a third segment, and a fourth segment of the power transmission line as having the fault, based on the identification of one of the first and the second half as having the fault, and a comparison of the arrival times of the first, second, and third peaks of the travelling wave at the first and second terminals, wherein identifying one of the first, second, third, and fourth segments of the power transmission line, as having the fault comprises:
      in response to identifying the first half of the power transmission line as having the fault
         determining a first difference between the arrival times, wherein the first difference is the absolute difference between arrival times of two consecutive peaks among the first, second, and third peaks of the travelling wave detected from the measurements carried out at the second terminal,
         identifying the first segment as having the fault, when the first difference is almost equals to zero, wherein the first segment ranges from the first terminal to one third of the length of the power transmission line, and
         identifying the second segment as having the fault, when the first difference is greater that a predefined threshold, wherein the second segment ranges from one third of the length of the power transmission line to half of the length of the power transmission line, and
      in response to identifying the second half of the power transmission line as having the fault
         determining a second difference between the arrival times, wherein the second difference is the absolute difference between arrival times of two consecutive peaks among the first, second, and third peaks of the travelling wave detected from the measurements carried out at the second terminal,
         identifying the third segment as having the fault, when the second difference is greater that the predefined threshold, wherein the third segment ranges from half of the length of the power transmission line to two third of the length of the power transmission line, and
         identifying the fourth segment as having the fault, when the second difference is almost equals to zero, wherein the fourth segment ranges from two third of the length of the power transmission line to the second terminal;
   estimating lengths of the power transmission line based on identification of one of the first, second, third, and fourth segments as having the fault, a comparison of the arrival times of the first, second, and third peaks of the travelling wave, arrival time of a first peak of a travelling wave reflected from the second terminal detected from the measurements carried out at the first terminal, and arrival time of a first peak of a travelling wave reflected from the first terminal detected from the measurements carried out at the second terminal; and
   estimating the fault location based on the identification of one of the first, second, third, and fourth segments as having the fault, the arrival times of the first, second, and third peaks of the travelling wave detected from measurements carried out at the first and second terminals, and estimated lengths of the power transmission line.

12. The method as claimed in claim 11, wherein estimating lengths of the power transmission line comprises:
- in response to identifying the first segment as having the fault, calculating a first estimated length of the power transmission line proportional to a sum of the difference between the arrival times of the first and second peaks of the travelling wave detected from the measurements carried out at the first terminal and the difference between arrival times of the first peak of the travelling wave reflected from the second terminal and the second peak of the travelling wave detected from the measurements carried out at the first terminal;
- in response to identifying one of the second segment and the third segment as having the fault, calculating a second estimated length of the power transmission line proportional to the difference between a sum of the arrival times of the second and third peaks of the travelling wave detected from the measurements carried out at the first terminal and twice the arrival time of the first peak detected from the measurements carried out at the first terminal; and
- in response to identifying the fourth segment as having the fault, calculating a third estimated length of the power transmission line proportional to the sum of a difference between the arrival times of the first and second peaks of the travelling wave detected from the measurements carried out at the second terminal and a difference between the arrival times of the first peak of the travelling wave reflected from the first terminal and the second peak of the travelling wave detected from the measurements carried out at the second terminal.

13. The method as claimed in claim 12, wherein the fault location in the first segment of the power transmission line is estimated from a ratio of a difference between the arrival times of the second and first peaks of the travelling wave detected from measurements carried out at the first terminal to the first estimated length and expressed in terms of fault location per unit length.

14. The method as claimed in claim 13, wherein the fault location in the second segment of the power transmission line is estimated from a ratio of a difference between the arrival times of the second and first peaks of the travelling wave detected from measurements carried out at the first terminal to the second estimated length and expressed in terms of fault location per unit length.

15. The method as claimed in claim 12, wherein the fault location in the second segment of the power transmission line is estimated from a ratio of a difference between the arrival times of the second and first peaks of the travelling wave detected from measurements carried out at the first terminal to the second estimated length and expressed in terms of fault location per unit length.

16. The method as claimed in claim 12, wherein the fault location in the third segment of the power transmission line is estimated from a ratio of a difference between the arrival times of the third and first peaks of the travelling wave detected from measurements carried out at the first terminal to the second estimated length and expressed in terms of fault location per unit length.

17. The method as claimed in claim 12, wherein the fault location in the fourth segment of the power transmission line is estimated from a ratio of a sum of the difference between the arrival times of the first and second peaks of the travelling wave detected from the measurements carried out at the second terminal and a difference between the arrival times of the first peak of the travelling wave reflected from the first terminal and the second peak of the travelling wave detected from the measurements carried out at the second terminal to the third estimated length and expressed in terms of fault location per unit length.

18. The method as claimed in claim 5, wherein the fault location in the second segment of the power transmission line is estimated from a ratio of a difference between the arrival times of the second and first peaks of the travelling wave detected from measurements carried out at the first terminal to the second estimated length and expressed in terms of fault location per unit length.

19. The method as claimed in claim 5, wherein the fault location in the third segment of the power transmission line is estimated from a ratio of a difference between the arrival times of the third and first peaks of the travelling wave detected from measurements carried out at the first terminal to the second estimated length and expressed in terms of fault location per unit length.

20. The method as claimed in claim 5, wherein the fault location in the fourth segment of the power transmission line is estimated from a ratio of a sum of the difference between the arrival times of the first and second peaks of the travelling wave detected from the measurements carried out at the second terminal and a difference between the arrival times of the first peak of the travelling wave reflected from the first terminal and the second peak of the travelling wave detected from the measurements carried out at the second terminal to the third estimated length and expressed in terms of fault location per unit length.

21. The method as claimed in claim 1, wherein the lengths of the power transmission line are estimated without using wave speed.

22. The method as claimed in claim 1, wherein the one of the first segment, the second segment, the third segment, and the fourth segment having the fault is identified without using a wave speed and/or without using a length of the power transmission line.

* * * * *